(12) United States Patent
Nguyen et al.

(10) Patent No.: US 7,285,503 B2
(45) Date of Patent: Oct. 23, 2007

(54) HERMETIC CAP LAYERS FORMED ON LOW-K FILMS BY PLASMA ENHANCED CHEMICAL VAPOR DEPOSITION

(75) Inventors: Vu Ngoc Tran Nguyen, Santa Clara, CA (US); Bok Hoen Kim, San Jose, CA (US); Kang Sub Yim, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 9 days.

(21) Appl. No.: 10/873,811

(22) Filed: Jun. 21, 2004

(65) Prior Publication Data

US 2005/0282404 A1    Dec. 22, 2005

(51) Int. Cl.
*H01L 21/31* (2006.01)
*H01L 21/469* (2006.01)

(52) U.S. Cl. .............. 438/789; 438/787; 438/788; 252/E21.029; 252/E21.277; 252/E21.576

(58) Field of Classification Search ............... 438/787, 438/788, 789
See application file for complete search history.

(56) References Cited

U.S. PATENT DOCUMENTS

| | | | |
|---|---|---|---|
| 5,567,661 A | 10/1996 | Nishio et al. | |
| 5,744,403 A | 4/1998 | Dein et al. | |
| 6,103,601 A | 8/2000 | Lee et al. | |
| 6,114,186 A | 9/2000 | Jeng et al. | |
| 6,374,770 B1 * | 4/2002 | Lee et al. ............... | 118/723 E |
| 6,475,925 B1 * | 11/2002 | Braeckelmann et al. ... | 438/763 |
| 6,599,643 B2 | 7/2003 | Heimann et al. | |
| 6,633,076 B2 | 10/2003 | Krishnaraj et al. | |
| 6,635,575 B1 | 10/2003 | Xia et al. | |
| 6,713,389 B2 | 3/2004 | Speakman | |
| 6,903,004 B1 * | 6/2005 | Spencer et al. .......... | 438/624 |
| 6,962,859 B2 * | 11/2005 | Todd et al. ............... | 438/482 |
| 2003/0207033 A1 | 11/2003 | Yim et al. | |
| 2004/0087139 A1 | 5/2004 | Yeh et al. | |

* cited by examiner

*Primary Examiner*—Alexander Ghyka
(74) *Attorney, Agent, or Firm*—Townsend and Townsend and Crew LLP

(57) ABSTRACT

A method of forming a cap layer over a dielectric layer on a substrate including forming a plasma from a process gas including oxygen and tetraethoxysilane, and depositing the cap layer on the dielectric layer, where the cap layer comprises a thickness of about 600 Å or less, and a compressive stress of about 200 MPa or more. Also, a method of forming a cap layer over a dielectric layer on a substrate including forming a process gas by flowing together about 200 mgm to about 8000 mgm of tetraethoxysilane, about 2000 to about 20000 sccm of oxygen ($O_2$), and about 2000 sccm to about 20000 sccm of carrier gas, generating a plasma from the process gas, where one or more RF generators supply about 50 watts to about 100 watts of low frequency RF power to the plasma, and about 100 watts to about 600 watts of high frequency RF power to the plasma, and depositing the cap layer on the dielectric layer.

26 Claims, 7 Drawing Sheets

US 7,285,503 B2

HERMETIC CAP LAYERS FORMED ON LOW-K FILMS BY PLASMA ENHANCED CHEMICAL VAPOR DEPOSITION

BACKGROUND OF THE INVENTION

Semiconductor device geometries have dramatically decreased in size since these devices were first introduced several decades ago. Paralleling this development, semiconductor device clock speeds, often measured in terms of frequency, have gone from kilohertz (kHz) to megahertz (MHz) to gigahertz (GHz), requiring electronic signals to travel across device interconnects with increasing speed. As device geometries shrink, and device speeds increase, the need to reduce increased power consumption and signal slowdown due to the RC time delay of the interconnects becomes increasingly important.

Two significant components of the RC time delay in interconnects are the resistance (R) of the conductive material (e.g., a metal such as Al or Cu) used in the interconnect, and the capacitance (C) of the dielectric materials that insulate the interconnect from other conductive regions. Progress has been made on reducing the resistance of the interconnect by, for example, switching from less conductive aluminum to more conductive copper. Progress has also been made on the development of dielectric materials having a lower dielectric capacity (i.e., low-κ materials) to reduce the capacitance side of the RC time delay.

A number of low-κ dielectric materials, and techniques for integrating them into semiconductor devices, have been developed. These include, for example, incorporating fluorine or other halogens (e.g., chlorine, bromine) into a silicon oxide layer. Other low-κ materials include spin-on-dielectrics such as hydrogen silsesquioxane (HSQ), and carbon-silicon containing dielectrics that are deposited by chemical vapor deposition (e.g., plasma CVD), to form silicon-oxygen-carbon (Si—O—C) dielectric films. These materials are often deposited at low temperature (e.g., about 100° C. to about 200° C.) and low density, and often have substantially high porosity.

The high porosity of many of these low-κ dielectric films makes them susceptible to being infiltrated by contaminants in an ambient atmosphere. For example, water vapor (i.e., moisture) can quickly permeate a porous dielectric material and increase the dielectric constant of the layer. In some instances, the increase in κ-value caused by the moisture can make the dielectric layer higher κ than conventional, undoped oxide layers. Thus, there is a need for methods of protecting low-κ dielectric layers from moisture infiltration that increases the dielectric constant of the layers.

BRIEF SUMMARY OF THE INVENTION

One embodiment of the invention includes a method of forming a cap layer over a dielectric layer on a substrate. The method includes forming a plasma from a process gas that includes oxygen and a silicon containing precursor. The method also includes depositing the cap layer on the dielectric layer, where the cap layer has a thickness of about 600 Å or less, and a compressive stress of about 200 MPa or more.

Another embodiment of the invention includes a method of forming a cap layer over a dielectric layer on a substrate. This method includes forming a process gas by flowing together about 200 mgm to about 8000 mgm of a silicon containing precursor, about 2000 to about 20000 sccm of oxygen ($O_2$), and about 2000 sccm to about 20000 sccm of carrier gas. The method also includes generating a plasma from the process gas, where one or more RF generators supply about 50 watts to about 100 watts of low frequency RF power to the plasma, and about 100 watts to about 600 watts of high frequency RF power to the plasma. The method further includes depositing the cap layer on the dielectric layer, where the cap layer has a compressive stress of 200 MPa or more.

Another embodiment of the invention includes a system for forming a cap layer over a dielectric layer on a substrate. The system includes a housing configured to form a processing chamber. The system also includes a gas distribution system to flow about 200 mgm to about 8000 mgm of a silicon containing precursor, about 2000 to about 20000 sccm of oxygen ($O_2$), and about 2000 sccm to about 20000 sccm of carrier gas through a gas distribution faceplate and into the processing chamber. The system further includes a plasma generation system configured to form a plasma within the processing chamber, where the plasma generation system comprises one or more RF generators that supply about 50 watts to about 100 watts of low frequency RF power to the plasma, and about 100 watts to about 600 watts of high frequency RF power to the plasma. In addition, the system includes a substrate holder configured to hold the substrate about 350 to about 450 mils from the gas distribution faceplate within the processing chamber, where the cap layer formed has a thickness of about 600 Å or less.

Additional features are set forth in part in the description that follows, and in part will become apparent to those skilled in the art upon examination of the following specification or may be learned by the practice of the invention. The features and advantages of the invention may be realized and attained by means of the instrumentalities, combinations, and methods particularly pointed out in the appended claims.

DETAILED DESCRIPTION OF THE INVENTION

The present invention includes methods of forming a cap layer on an underlying dielectric layer to prevent moisture from infiltrating the underlying layer and increasing its κ-value (among other adverse effects). The cap layer may also act as a barrier for gaseous contaminants (e.g., $NH_x$) diffusing through a porous dielectric layer and poisoning photoresist layers. These and other diffusion problems are becoming increasingly significant as development trends for low-κ dielectric layers often favor the increasing porosity of these layers.

Cap layers made according to embodiments of the methods of the invention are formed with compressive stresses (e.g., about 200 MPa to about 300 MPa or more) that make the cap layer an effective diffusion barrier to prevent moisture and other gaseous compounds from moving into and out of underlying dielectric layers. Experiments show that cap layers formed according to the invention with these compressive stresses can act as effective moisture barriers at thicknesses of about 200 Å or less. Because these cap layers can serve as effective moisture/contaminant barriers while remaining thin, their impact on the κ value of the dielectric layer is reduced. Some exemplary device structures that include the cap layers formed according to embodiments of methods of the invention are now described.

Exemplary Device Structures

Figure 1:
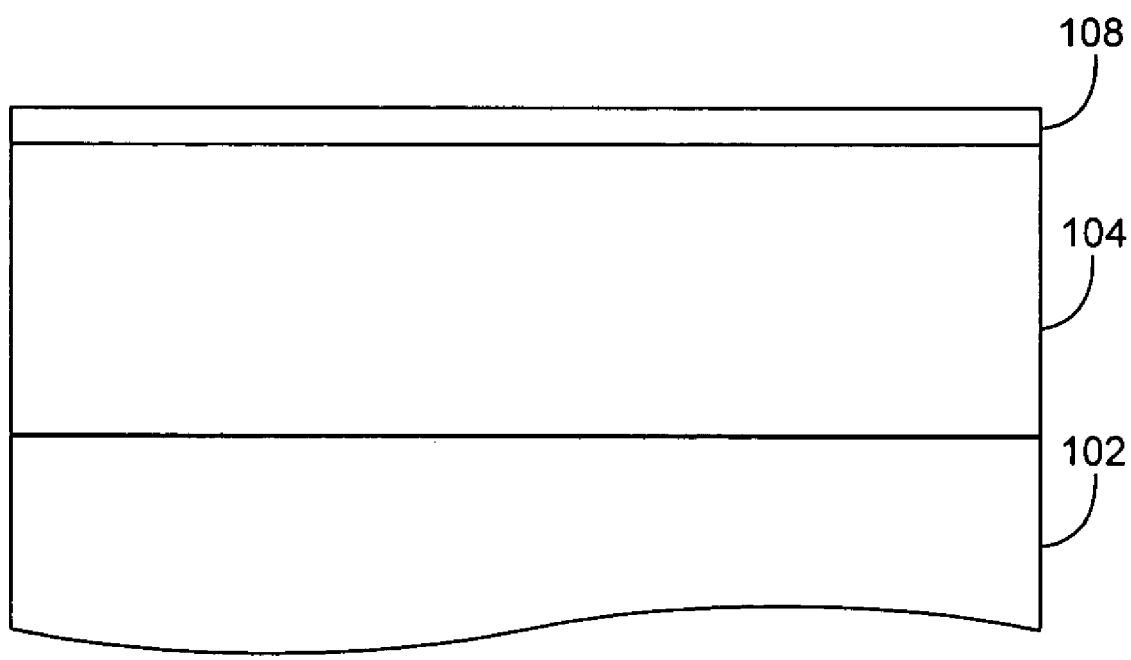
FIG. 1 is a cross-sectional view of device layers including a cap layer formed according to embodiments of the invention.

FIG. 1 shows a cross-sectional view of device layers including a cap layer formed according to embodiments of the invention. The layers include an underlying layer 102, which may be, for example, a semiconductor substrate (e.g., a Si substrate), a metal interconnect layer (e.g., a Al or Cu layer), or a silicide layer (e.g., an alloy of silicon and Ti, Ni or Co in contact with an underlying source, drain or gate electrode), among other kinds of layers. Underlying layer 102 may be the lowest, base layer of the device (e.g., a 200 mm or 300 mm substrate wafer) or it may lie on top of other layers.

Above the underlying layer 102 is dielectric layer 104. Dielectric layer 104 is formed from a low-κ dielectric material having a dielectric constant (κ) of about 4 or less (e.g., about 3.5 or less, about 3 or less, about 2.5 or less, about 2 or less, etc.). These materials may include, for example, silicon-oxygen-carbon materials (e.g., silicon oxycarbide (SiOCH)), parylene, amorphous fluorinated carbon materials, and hydrogen silsesquioxane (HSQ), among other low-κ dielectric materials. The materials may be deposited on underlying layer 102 using a variety of techniques including thermal CVD, plasma CVD, and spin-on techniques, among others.

As noted above, many of the materials and deposition techniques used to form dielectric layer 104 create a layer having high porosity and low density. The density of dielectric layer 104, as measured by a comparison of the layer's etch rate with a thermal oxide layer (i.e., the wet etch rate ratio (WERR)) may be about 1.5 or more (e.g., about 2 or more, about 3 or more, etc.). The low-density of dielectric layer 104 allows gases such as water vapor and nitrogen to diffuse quickly through the layer.

In order to decrease the diffusion of gases through dielectric layer 104, a cap layer 108 is formed on top of the dielectric layer 104. Cap layer 108 may be made from silicon dioxide that is deposited by plasma CVD from a mixture of a silicon precursor (e.g., silane ($SiH_4$), tetraethylorthosilicate (TEOS), octamethylcyclotetrasiloxane (OMCTS), etc.), oxygen (e.g., $O_2$), and a carrier gas (e.g., helium (He)). Additional details about the method of forming the cap layer are described below.

Cap layer 108 may be substantially thinner than the underlying dielectric layer 104. For example, embodiments of the cap layer 108 may have a thickness of about 600 Å or less, or 200 Å or less. Embodiments also include a thickness for the cap layer from about 200 Å to about 600 Å.

Cap layer 108 may be formed with compressive stress, which is believed to enhance the ability of cap layer 108 to block water vapor and other gases from entering and exiting the dielectric layer 104. The cap layer 108 may have compressive stress of 200 megapascals (MPa) or more (e.g., about 200 MPa to about 300 MPa, about 300 MPa or more, etc.).

Figure 2A:
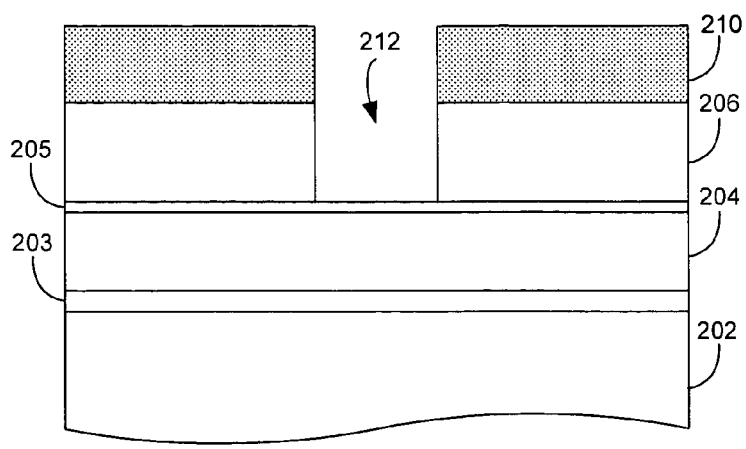
FIGS. 2A-C are cross sectional views of device layers including a trench for a dual-damascene interconnect and a cap layer formed according to embodiments of the invention.
Figure 2B:
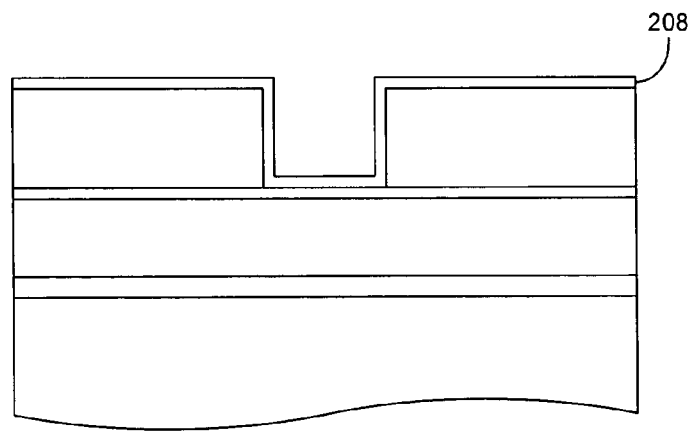
Figure 2C:
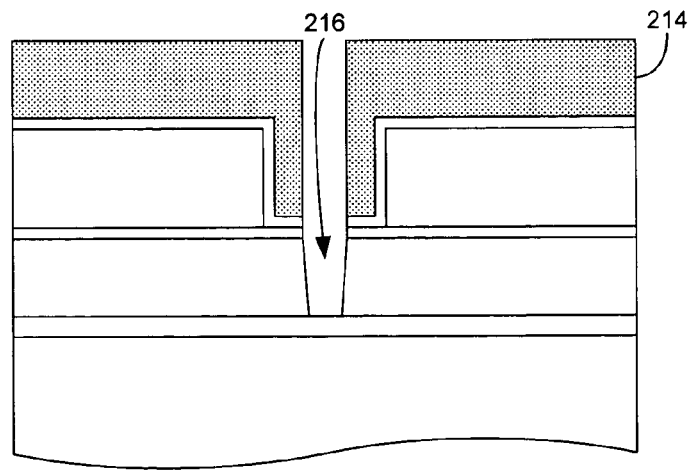

Referring now to FIGS. 2A-C, cross sectional views of device layers including a trench 216 for a dual-damascene interconnect and a cap layer 208 formed according to embodiments of the invention are shown. The trench 216 may be formed according to a dual-damascene processes that starts with the formation of barrier layer 203 (e.g., a silicon nitride layer), first dielectric layer 204, etch-stop layer 205, and second dielectric layer 206 on underlying layer 202 as shown in FIG. 2A. A first photoresist 210 may be formed on top of the second dielectric layer 206 and developed to form a mask pattern that exposes a portion of the underlying dielectric layer 206. Dielectric layer 206 may then be etched down to etch-stop layer 205 to form first trench 212.

Following the formation of first trench 212, the mask layer formed by first photoresist 210 may be removed and cap layer 208 may be formed over the dielectric layer 206 as shown in FIG. 2B. A second photoresist 214 (e.g., a DUV photoresist) may be formed over the cap layer 208 and developed to form a mask pattern that exposes a portion of the cap layer 208 inside trench 212 as shown in FIG. 2C.

The cap layer 208 may act as a barrier that prevents gaseous contaminants from diffusing up from the etch-stop layer 205 and through the sides of dielectric layer 206 into the second photoresist 214. Some of these contaminants (e.g., $NH_x$) may react (sometimes called "resist poisoning") with materials in the second photoresist 214 to create "footings" (i.e., undeveloped portions of photoresist formed along the walls and bottom of trench 212 that interfere with the patterning of features underneath the photoresist.)

In addition, an anti-reflective coating (not shown) may be formed on the cap layer 208 before second photoresist layer 214 is deposited. The ARC coating reduces the amount of light reflecting from underlying layers into photoresist layer 214 and reducing the sharpness of the subsequently formed mask pattern. Cap layer 208 prevents materials in the ARC coating from penetrating into the underlying, porous dielectric layer 206.

After the mask pattern is formed in second photoresist layer 214, a second trench 216 may be etched into the first dielectric layer 204 down to the barrier layer 203. The combination of the first trench 212 and second trench 216 forms the gap which may be filled with a conductive material (not shown) to form a dual-damascene interconnect.

Exemplary Method of Forming a Cap Layer

Figure 3:
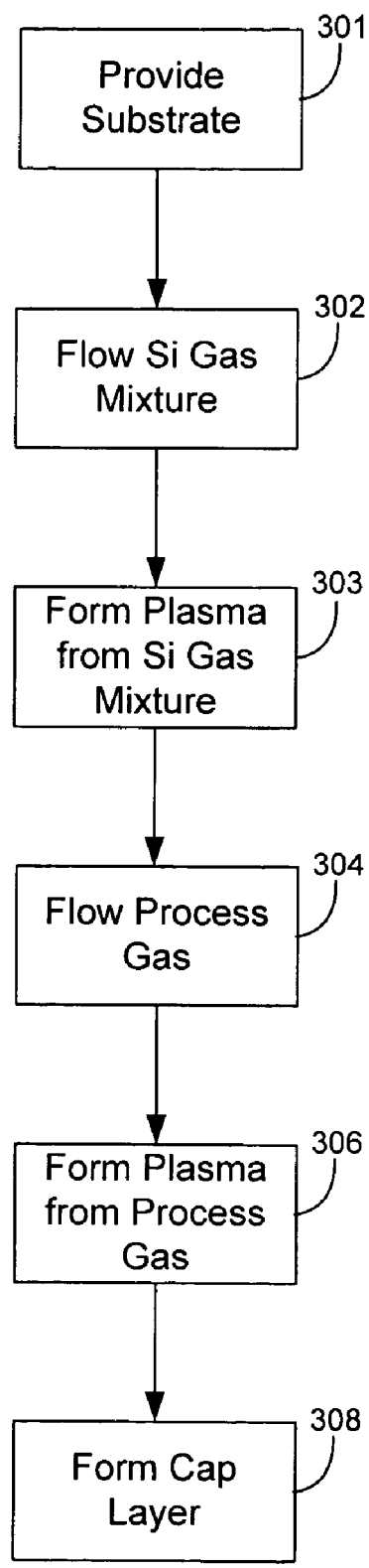
FIG. 3 is a flowchart illustrating methods of forming a cap layer according to embodiments of the invention.
Figure 4A:
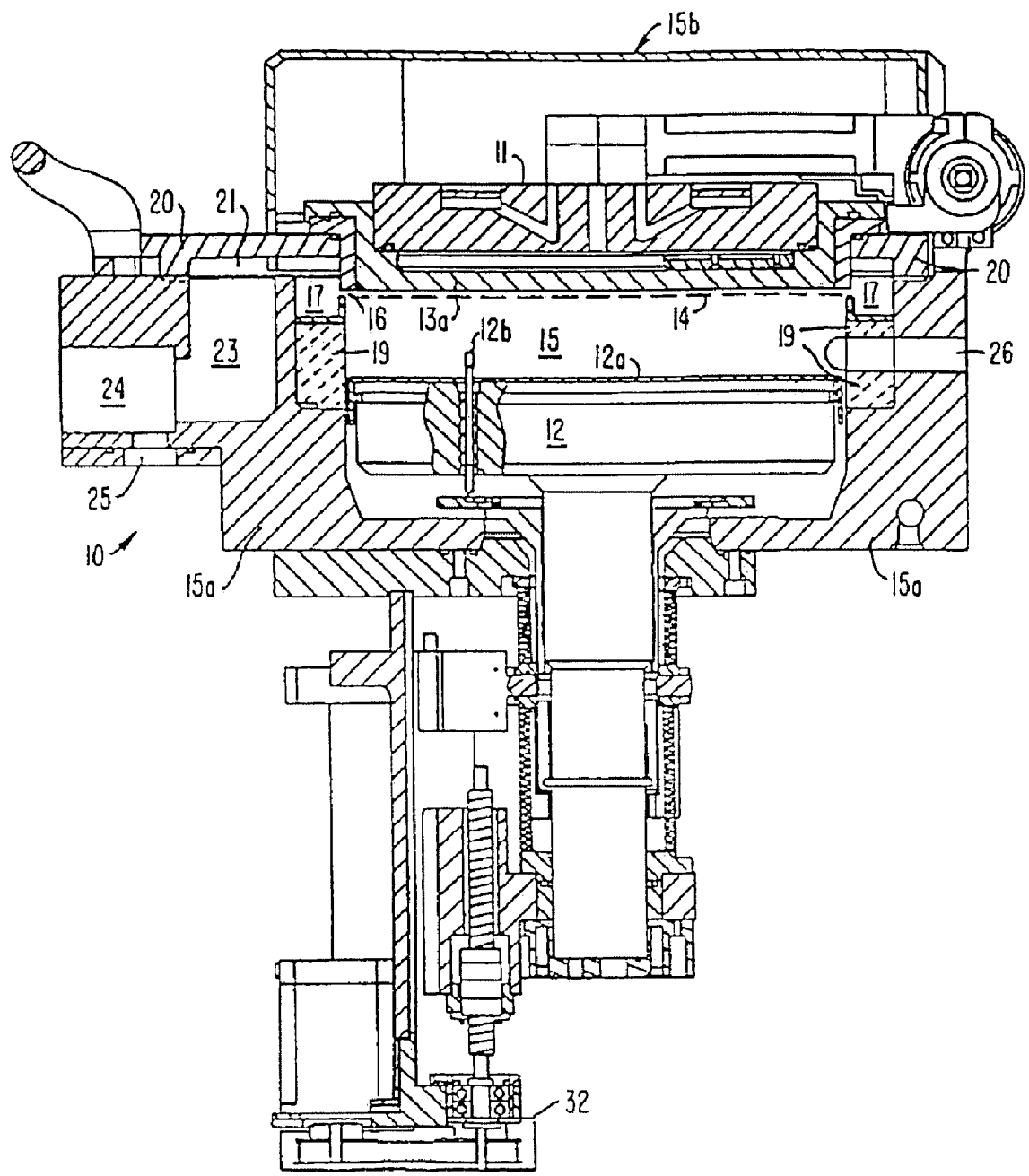
FIGS. 4A and 4B are cross-sectional views of an embodiment of a chemical vapor deposition apparatus that may be used in conjunction with embodiments of the invention.
Figure 4B:
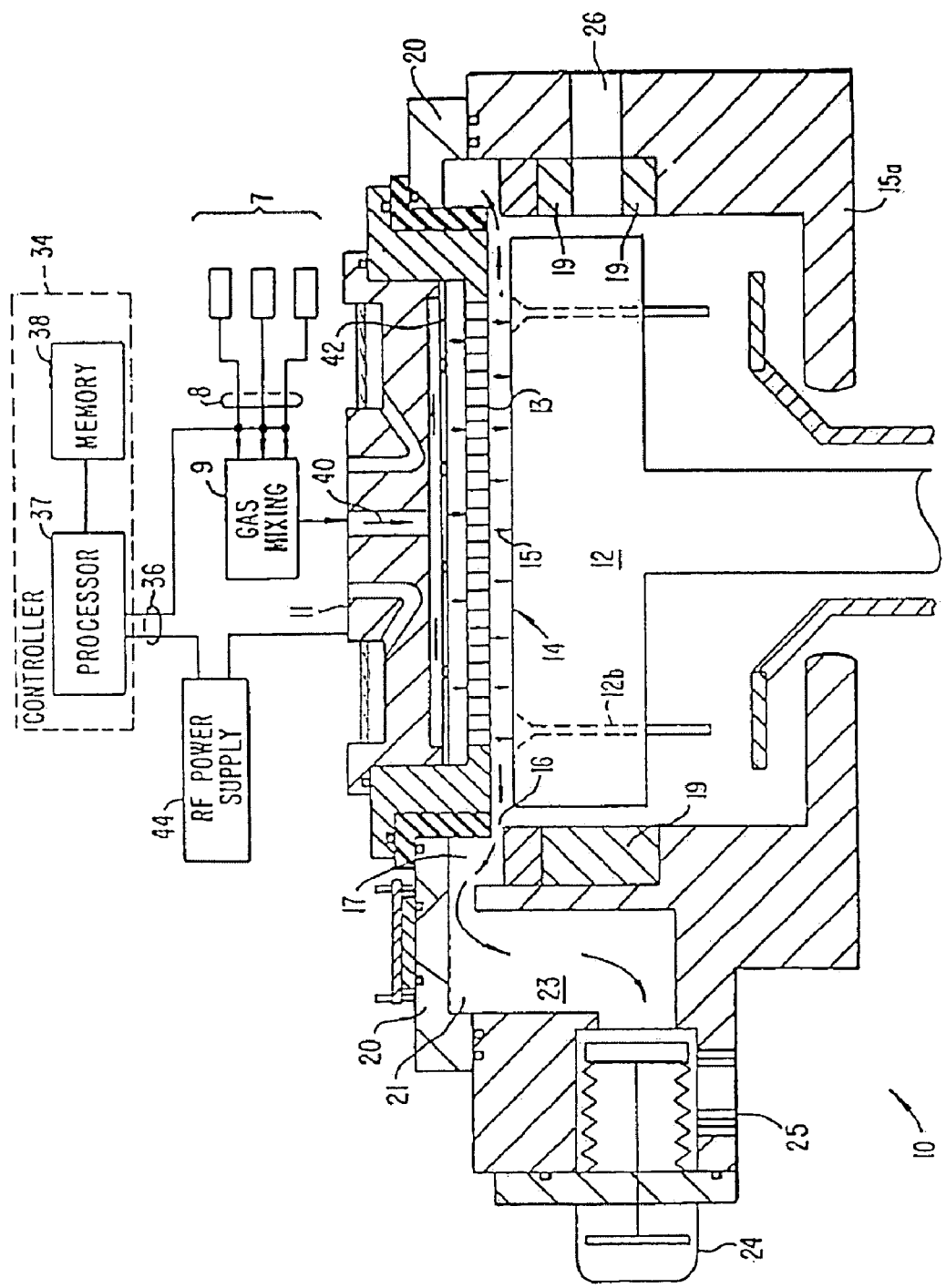

FIG. 3 shows a flowchart illustrating methods of forming a cap layer according to embodiments of the invention. The method starts by providing a substrate 301 upon which the cap layer will be formed. The substrate may be, for example, a conventional 200 mm or 300 mm silicon wafer. Additional layers, such as the low-κ dielectric layer shown in FIG. 1, may be formed on the substrate from a previous process (not shown). The dielectric layers may include gaps (e.g., shallow trench structures, deep trench structures, etc.) such as those shown and described above in FIGS. 2A-C.

An optional silicon pretreatment step may be useful for sealing channels and pores in the upper portions of porous dielectric layers prior to the formation of the cap layer. Reactive species from oxygen containing gases (e.g., $O_2$) can infiltrate pores and channels of porous low-κ dielectric layers during the deposition of the cap layer and damage the dielectric material. Filling these pores with silicon containing materials may help prevent degradation of the dielectric layer during the formation of the cap layer.

The pretreatment step prior to the formation of the cap layer includes flowing a silicon gas mixture 302 that may include, for example, a silicon containing precursor (e.g., TEOS) and carrier gas (e.g., He). The silicon gas mixture is used to form a plasma 303 whose reactive species (e.g., Si) may form deposits in the pores and on the surface of the dielectric layer.

Following the pretreatment step (if performed) a process gas may flow 304, which supplies precursor materials for the cap layer. The process gas may include a silicon containing percursor (e.g., silane ($SiH_4$), tetraethylorthosilane (TEOS), octamethylcyclotetrasiloxane (OMCTS), etc.), an oxygen containing gas (e.g., oxygen ($O_2$)) and a carrier gas (e.g., helium). In one embodiment, a combination of TEOS flowing at a rate of about 200 to about 8000 milligrams per minute (mgm), $O_2$ flowing at a rate of about 2000 to about 20,000 sccm, and helium flowing at a rate of about 2000 to 20,000 sccm make up the process gas being fed to the process chamber.

A plasma may be formed from the process gas 306 through a plasma generation system coupled to or integrated with the process chamber. The plasma generation system may include one or more RF generators that, for a 200 mm wafer, may generate about 40 to about 60 watts (e.g., about 50 watts) of low frequency (e.g., about 350 to about 550 kHz) RF power to the plasma, and about 100 to about 300 watts of high frequency (e.g., about 10 to 15 MHz) RF power to the plasma. When 300 mm wafer substrates are used, the power generated may be increased to about 80 to about 120 watts for the low frequency RF power, and about 200 to about 600 watts for the high frequency RF power.

Reactive species in the plasma may then be deposited over a dielectric layer on the substrate to form the cap layer 308. The cap layer deposition rate may range from about 800 to about 1000 Å/min (e.g., about 875 Å/min) to deposit a cap layer having a thickness of about 600 Å or less (e.g., about 200 to about 600 Å, about 200 Å or less, etc.).

Exemplary Process Chamber

An exemplary CVD process chamber in which embodiments of the method of the present invention can be carried out is shown in FIGS. 1A and 1B. FIG. 1A shows a vertical, cross-sectional view of a CVD system 10, having a vacuum or processing chamber 15 that includes a chamber wall 15a and chamber lid assembly 15b.

CVD system 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the wafers.

Deposition and carrier gases are introduced into chamber 15 through perforated holes of a conventional flat, circular gas distribution or faceplate 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a.

Before reaching the manifold, deposition and carrier gases are input from gas sources 7 through gas supply lines 8 (FIG. 1B) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in CVD system 10 may be a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 450 KHz to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

CVD system 10 may also be used for thermal deposition processes. During a thermal deposition process, a heat transfer liquid is circulated through the walls 15a of the process chamber to maintain the chamber at a constant temperature to prevent condensation of liquid precursors and reduce gas phase reactions that could create particles. A portion of these heat-exchanging passages in the lid of chamber 15 is shown in FIG. 1B. The passages in the remainder of chamber walls 15a are not shown. Fluids used to heat the chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side-wall 15a (including the upper dielectric lining 19 on the wall) and the bottom of the circular chamber lid 20. The 360.degree. circular symmetry and uniformity of the slot orifice 16 and the plenum 17 help achieve a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12. Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 is assigned to Applied Materials, Inc., the assignee of the present invention, and is hereby incorporated by reference in its entirety.

A lift mechanism and motor 32 (FIG. 1A) raises and lowers the heater pedestal assembly 12 and its wafer lift pins 12b as wafers are transferred into and out of the body of the chamber by a robot blade (not shown) through an insertion/removal opening 26 in the side of the chamber 15. The motor 32 raises and lowers pedestal 12 between a processing position 14 and a lower, wafer-loading position. The motor, valves or flow controllers connected to the supply lines 8, gas delivery system, throttle valve, RF power supply 44, and chamber, substrate heating system and heat exchangers H1, H2 are all controlled by a system controller 34 (FIG. 1B) over control lines 36, of which only some are shown. Controller 34 relies on feedback from optical sensors to determine the position of movable mechanical assemblies such as the throttle valve and susceptor which are moved by appropriate motors under the control of controller 34.

In some embodiments, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

Experimental Results and Measurements

Hermeticity tests were conducted on cap layers deposited over low-κ dielectric layers formed on 200 mm and 300 mm substrate wafers. These tests can gauge the effectiveness of cap layers in preventing moisture from reaching underling dielectric layers. The tests measure changes in stress levels of a dielectric layer caused by the absorption/uptake of moisture by the layer. The change in the stress of the dielectric layer is found by measuring the change in the curvature of the substrate wafer caused by the change in stress in the dielectric layer. The change in curvature may in turn be measured by a change in the deflection path of a laser beam that is being reflected off the surface of the wafer.

A quantitative relationship between the change in stress in the dielectric layer caused by the absorption/uptake of moisture and the measured deflection of the laser beam may be given by:

$$\text{Stress} = \frac{ED^2}{6(1-\nu)t}\left(\frac{1}{R}\right)$$

where: E=Young's modulus of the substrate
ν=Poisson's ratio of the substrate
D=thickness of the substrate
t=thickness of the dielectric layer, and $$R = 2L\frac{dx}{dz},$$

where: L=path length of the laser beam, and $\frac{dx}{dz}$ = the change of the laser beam direction along the x-axis as a function of change in the direction of the orthogonal z-axis The cap layers tested in the hermeticity tests were formed on low-κ dielectric layers supported on 200 mm or 300 mm substrate wafers. The low-κ dielectric layers were formed from tensile, carbon-containing oxide materials that exhibit significant stress changes when exposed to moisture (e.g., ambient moisture from room temperature air).

Cap layers of various thicknesses and compressive stress levels are formed on the dielectric layers for the hermeticity tests. Cap layers having thickness of 200 Å, 400 Å, and 600 Å are each formed with compressive stresses of −100 MPa, −200 MPa and −300 MPa on both 200 mm and 300 mm substrates, allowing hermeticity test to be performed on 18 different wafer configurations. The hermeticity of each wafer was tested using an "85/85 test," where the wafers were stored at a temperature of 85° C. in an atmosphere having 85% relative humidity for 17 hours prior to measuring the change in the stress level of the capped dielectric layer.

The cap layers were deposited on 200 mm wafer substrates using a plasma CVD chamber. The substrate and dielectric layer was heated to about 400° C. while a process gas that included TEOS flowing at about 300 mgm, oxygen ($O_2$) flowing at about 3000 sccm and helium flowing about 3000 sccm, were used in the formation of the plasma. Plasma was energized by a combination high and low frequency RF power, where the low frequency power was kept constant at about 50 watts while the high frequency power was adjusted between about 120 and 210 watts (i.e., 120 W, 160 W, or 210 W) depending on the target compressive stress level (i.e., −100 MPa, −200 MPa, or −300 MPa)

for the cap layer. For each cap layer deposition, the wafer substrate was spaced about 420 mils from the showerhead where the processes gases entered the deposition chamber. Table 1 lists some properties of the cap layers formed on the 200 mm substrate wafers that were tested with the 85/85 test.

TABLE 1

Properties of Cap Layers Formed on 200 mm Wafers

| Cap Layer Property | Stress Level (MPa)* | | |
|---|---|---|---|
| | −100 | −200 | −300 |
| High Frequency RF Power (Watts) | 120 | 160 | 210 |
| Deposition Rate (Å/min) | 980 | 925 | 875 |
| Uniformity, % 1 s | 1.9 | 1.7 | 1.2 |
| Uniformity, % R/2 | 3.0 | 2.8 | 2.6 |
| RI | 1.460 | 1.462 | 1.465 |
| WERR @ 10 min 100:1 HF | 4.2 | 2.9 | 2.5 |
| Density (g/cm$^3$) | 2.221 | 2.228 | 2.23 |

Figure 5:
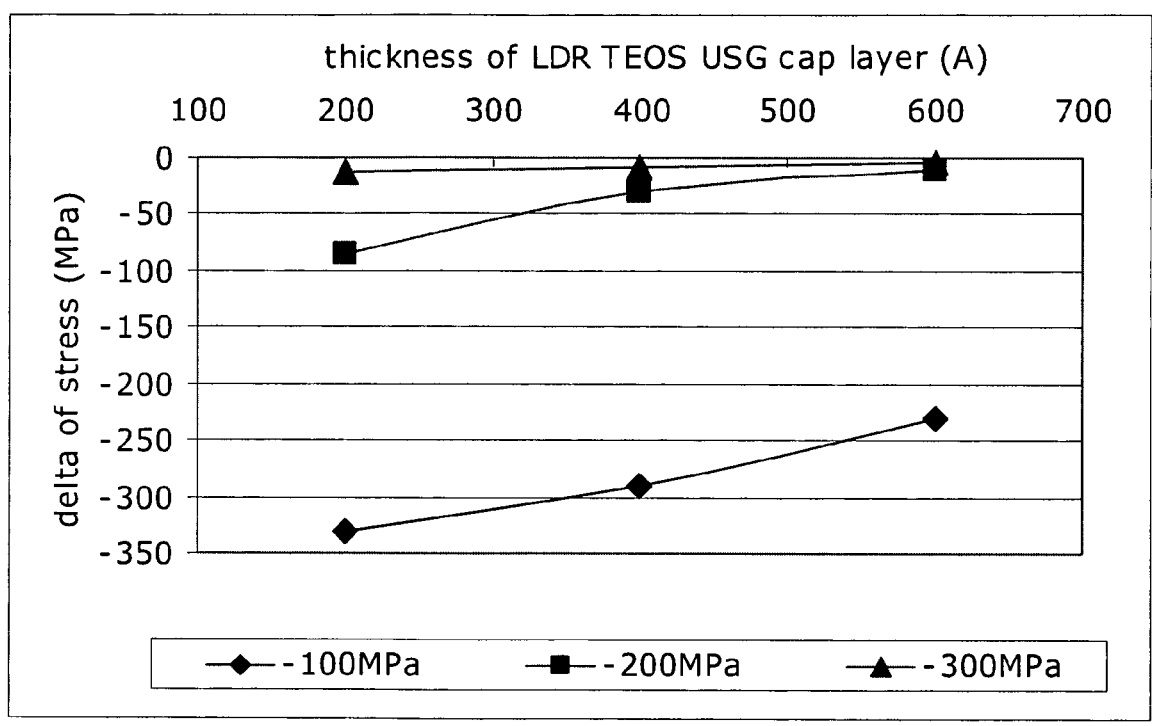
FIG. 5 is a plot of humidity induced stress versus cap layer thickness for cap layers formed with varying compressive stresses on a 200 mm wafer.

*Negative MPa values denote compressive stress while positive MPa values denote tensile stress FIG. 5 plots the measured changes in stress level of the dielectric layer on a 200 mm wafer following the 85/85 hermeticity test as a function of thickness and compressive stress of the overlying cap layer. The plot shows that the cap layers formed with a compressive stress of about −300 MPa provided the highest levels of hermeticity (i.e., least change in the stress levels of the dielectric layer) at all three cap layer thicknesses (i.e., 200 Å, 400 Å, and 600 Å).

Figure 6:
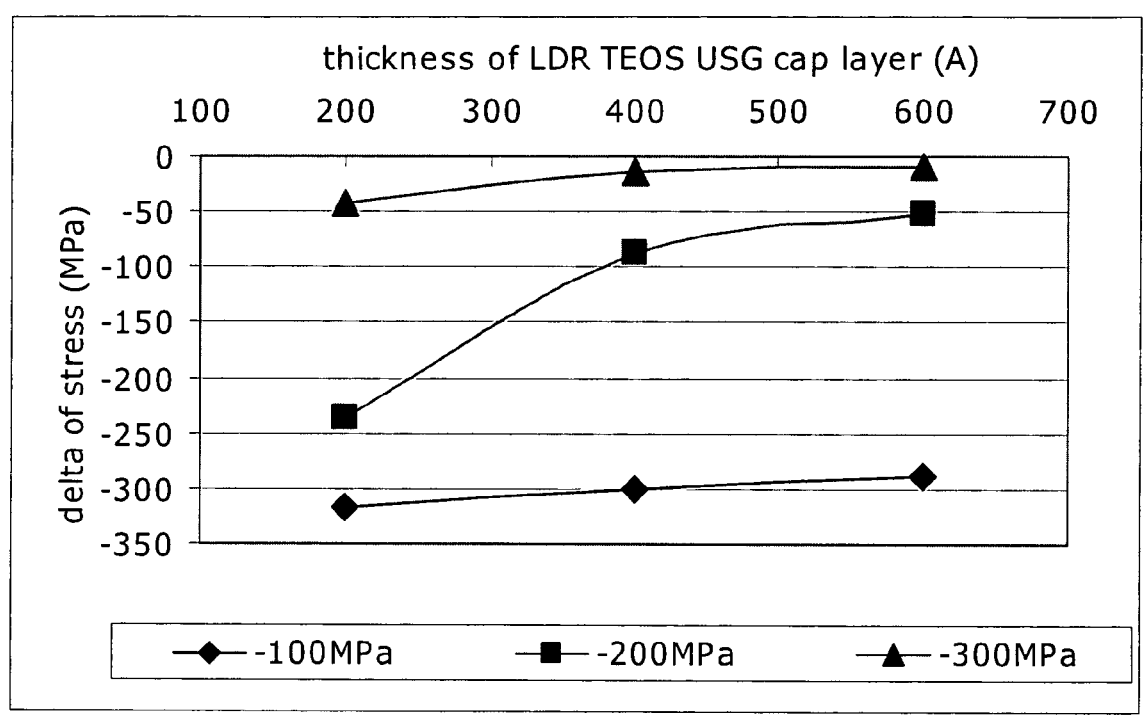
FIG. 6 is a plot of humidity induced stress versus cap layer thickness for cap layers formed with varying compressive stresses on a 300 mm wafer.

FIG. 6 plots the measured changes in stress level of the dielectric layer on a 300 mm wafer following the 85/85 hermeticity test as a function of thickness and compressive stress of the overlying cap layer. Similar to the results for the 200 mm wafer, cap layers formed with compressive stress of −300 MPa showed the highest levels of hermeticity at all three cap layer thicknesses.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A method of forming a cap layer over a dielectric layer on a substrate, the method comprising:
   forming a first plasma from a first precursor comprising silicon;
   pretreating a deposition surface of the dielectric layer with the first plasma, wherein the dielectric layer is a low-κ dielectric layer comprising silicon and carbon, and wherein the first plasma deposits silicon in at least one pore on the deposition surface;
   forming a second plasma from a second process gas comprising oxygen and a silicon containing precursor; and
   depositing the cap layer on the dielectric layer, wherein the cap layer comprises a thickness of about 600 Å or less, and a compressive stress of about 200 MPa or more.

2. The method of claim 1, wherein the thickness of the cap layer is about 200 Å to about 600 Å.

3. The method of claim 1, wherein the thickness of the cap layer is about 200 Å or less.

4. The method of claim 1, wherein the compressive stress of the cap layer is about 200 MPa to about 300 MPa.

5. The method of claim 1, wherein the compressive stress of the cap layer is about 300 MPa or more.

6. The method of claim 1, wherein the substrate comprises a 200 mm wafer.

7. The method of claim 6, wherein the forming of the second plasma comprises:
   striking the second plasma using one or more RF generators, wherein the RF generators supply a low frequency RF power of about 50 watts, and supply a high frequency RF power from about 100 watts to about 300 watts.

8. The method of claim 7, wherein the low frequency power is about 350 to about 550 kHz, and the high frequency power is about 10 to about 15 MHz.

9. The method of claim 1, wherein the substrate comprises a 300 mm wafer.

10. The method of claim 9, wherein the forming of the second plasma comprises:
    striking the second plasma using one or more RF generators, wherein the RF generators supply a low frequency RF power of about 100 watts, and supply a high frequency RF power from about 200 watts to about 600 watts.

11. The method of clam 1, wherein the cap layer is formed at a rate of about 875 Å/min or less.

12. The method of clam 1, wherein the silicon containing precursor comprises silane, tetraethoxysilane, or octamethylcyclotetrasiloxane.

13. The method of claim 1, wherein the method further comprises depositing a bottom antireflective coating (BARC) layer on the cap layer, wherein the cap layer prevents materials from the BARC layer from contaminating the dielectric layer.

14. A method of forming a cap layer over a dielectric layer on a substrate, the method comprising:
    pretreating a deposition surface of the dielectric layer with the first plasma, wherein the dielectric layer is a low-κ dielectric layer comprising silicon and carbon, and wherein the first plasma deposits silicon in at least one pore on the deposition surface;
    forming a process gas by flowing together about 200 mgm to about 8000 mgm of a silicon containing precursor, about 2000 to about 20000 sccm of oxygen ($O_2$), and about 2000 sccm to about 20000 sccm of carrier gas;
    generating a second plasma from the process gas, wherein one or more RF generators supply about 50 watts to about 100 watts of low frequency RF power to the plasma, and about 100 watts to about 600 watts of high frequency RF power to the plasma; and
    depositing the cap layer on the dielectric layer, wherein the cap layer has a compressive stress of 200 MPa or more.

15. The method of claim 14, wherein the compressive stress of the cap layer is about 300 MPa or more.

16. The method of claim 14, wherein the cap layer has a thickness of about 600 Å or less.

17. The method of claim 14, wherein the cap layer has a density of 2.22 g/cm$^3$ or more.

18. The method of claim 14, wherein the cap layer comprises undoped silicate glass.

19. The method of claim 14, wherein the dielectric layer is a silicon-oxygen-carbon (Si—O—C) layer.

20. The method of claim 14, wherein the dielectric layer has a wet etch rate ratio (WERR) of 2.5:1 or more.

21. The method of claim 14, wherein the carrier gas is helium.

22. The method of claim 14, wherein the silicon containing precursor comprises silane, tetraethoxysilane, or octamethylcyclotetrasiloxane.

23. A method of forming a cap layer over a dielectric layer on a substrate, the method comprising:

forming a first plasma from a first precursor comprising silicon;

pretreating a deposition surface of the dielectric layer with the first plasma, wherein the first plasma deposits a silicon in at least one pore on the deposition surface, and wherein the silicon is thinner than the dielectric layer;

forming a second plasma from a second process gas comprising oxygen and a silicon containing precursor; and depositing the cap layer on the dielectric layer, wherein the cap layer comprises a thickness of about 600 Å or less, and a compressive stress of about 200 MPa or more.

24. The method of claim 23, wherein the dielectric layer is a low-κ dielectric layer comprising silicon and carbon.

25. The method of claim 24, wherein the dielectric layer is a silicon-oxygen-carbon (Si—O—C) layer.

26. The method of claim 1, wherein the dielectric layer is a silicon-oxygen-carbon (Si—O—C) layer.

* * * * *